United States Patent
Moondanos et al.

(10) Patent No.: US 7,159,201 B2
(45) Date of Patent: Jan. 2, 2007

(54) METHOD AND APPARATUS FOR CUT-POINT FRONTIER SELECTION AND FOR COUNTER-EXAMPLE GENERATION IN FORMAL EQUIVALENCE VERIFICATION

(75) Inventors: John Moondanos, San Francisco, CA (US); Zurab Khasidashvili, Rishon le Zion (IL); Ziyad E. Hanna, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/898,574

(22) Filed: Jul. 23, 2004

(65) Prior Publication Data

US 2005/0005251 A1    Jan. 6, 2005

Related U.S. Application Data

(62) Division of application No. 10/291,287, filed on Nov. 7, 2002, now Pat. No. 6,792,581.

(51) Int. Cl.
G06F 17/50 (2006.01)
(52) U.S. Cl. .............................. 716/7; 716/3
(58) Field of Classification Search .................... 716/1, 716/3–7, 18; 702/123, 181
See application file for complete search history.

(56) References Cited

U.S. PATENT DOCUMENTS

| | | | |
|---|---|---|---|
| 5,202,889 A | 4/1993 | Aharon et al. | |
| 5,331,568 A | 7/1994 | Pixley | |
| 5,544,067 A | 8/1996 | Rostoker et al. | |
| 5,638,381 A * | 6/1997 | Cho et al. | 714/732 |
| 5,724,504 A | 3/1998 | Aharon et al. | |
| 5,748,497 A | 5/1998 | Scott et al. | |
| 5,754,454 A * | 5/1998 | Pixley et al. | 702/123 |
| 5,801,958 A | 9/1998 | Dangelo et al. | |
| 5,937,183 A * | 8/1999 | Ashar et al. | 703/14 |
| 6,006,028 A | 12/1999 | Aharon et al. | |
| 6,035,107 A | 3/2000 | Kuehlmann et al. | |
| 6,035,109 A | 3/2000 | Ashar et al. | |
| 6,086,626 A | 7/2000 | Jain et al. | |
| 6,195,788 B1 | 2/2001 | Leaver et al. | |
| 6,212,669 B1 | 4/2001 | Jain | |
| 6,269,467 B1 | 7/2001 | Chang et al. | |
| 6,301,687 B1 * | 10/2001 | Jain et al. | 716/3 |

(Continued)

OTHER PUBLICATIONS

Shi-Yu Huang, Kwang-Ting Cheng, Kuang-Chien Chen, "Aquila: An Equivalence Verifier for Large Sequential Circuits", Proceedings of Asia and South Pacific Design Automation Conference, Jan. 1997, pp. 455-460.

(Continued)

*Primary Examiner*—Jack Chiang
*Assistant Examiner*—Binh Tat
(74) *Attorney, Agent, or Firm*—Cynthia Thomas Foatz

(57) ABSTRACT

An approach for cut-point frontier selection and/or counter-example generation. Both a lazy and an eager cut-point frontier are identified. A reconvergence (or non-reconvergence) ratio is then computed for each of the frontiers and the one with the smaller (larger) reconvergence (non-reconvergence) ratio is selected as the next cut-point frontier. For another aspect, to generate a counter-example, in response to identifying a difference in output signals for a given cut-point frontier, values of eigenvariables and reconverging primary inputs are used to compute the corresponding values of the non-reconverging primary inputs. These corresponding values are then computed to be compatible with the internal signal values implied by the cut-point frontier selections that were made to expose the difference in the outputs.

18 Claims, 8 Drawing Sheets

U.S. PATENT DOCUMENTS

| | | | |
|---|---|---|---|
| 6,308,299 B1 * | 10/2001 | Burch et al. | 716/4 |
| 6,334,205 B1 * | 12/2001 | Iyer et al. | 716/7 |
| 6,378,112 B1 | 4/2002 | Martin et al. | |
| 6,408,424 B1 | 6/2002 | Mukherjee et al. | |
| 6,449,750 B1 | 9/2002 | Tsuchiya | |
| 6,470,482 B1 | 10/2002 | Rostoker et al. | |
| 6,473,884 B1 * | 10/2002 | Ganai et al. | 716/3 |
| 6,484,135 B1 | 11/2002 | Chin et al. | |
| 6,564,358 B1 * | 5/2003 | Moondanos et al. | 716/5 |
| 2001/0025369 A1 | 9/2001 | Chang et al. | |
| 2002/0073380 A1 | 6/2002 | Cooke et al. | |
| 2002/0108093 A1 | 8/2002 | Moondanos et al. | |
| 2002/0144215 A1 | 10/2002 | Hoskote et al. | |
| 2003/0200073 A1 | 10/2003 | Rich et al. | |

OTHER PUBLICATIONS

Paruthi et al., "Equivalence Checking Combing a Structural SAT-solver, BDDs, and Simulation", Proceeding of the 2000 International Conference on Computer Design, pp. 459-464, Sep. 17, 2000.

Krohm et al., "The Use of Random Simulation in Formal Verification", Proceedings of the 1996 IEEE International Conference on Computer Design: VSLI in Computers and Processors, pp. 371-376, Oct. 7, 1996.

Rho et al., "Inductive Verification of Iterative Systems", Proceedings of the 29th ACM/IEEE Design Automation Conference, pp. 628-633, Jun. 8, 1992.

C. Leonard Berman, Louise H. Trevillyan, "Functional Comparison of Logic Designs for VLSI Circuits", 1989 IEEE, pp. 456-459.

Masahiro Fujita, Hisanori Fujisawa, Nobuaki Kawato, "Evaluation and Improvements of Boolean Comparison Method Based on Binary Decision Diagrams", 1988 IEEE, pp. 2-5.

Richard Rudell, "Dynamic Variable Ordering for Ordered Binary Decision Diagrams", 1993 IEEE, pp. 42-47.

Andreas Kuehlmann, Florian Krohm, "Equivalence Checking Using Cuts and Heaps", pp. 263-268, unavailable.

Rajarshi Mukherjee, Jawahar Jain, Koichiro Takayama, Masahiro Fujita, Jacob A. Abraham, Donald S. Fussell, Efficient Combinational Verification Using BDDs and a Hash Table, 1997 IEEE, Jun. 9-12, 1997, Hong Kong, pp. 1025-1028.

Elena Dubrova, Luca Macchiarulo, "A Comment on Graph-Based Algorithm for Boolean Function Manipulation", 2000 IEEE, vol. 49, No. 11, Nov. 2000, pp. 1290-1292.

Subodh M. Reddy, Wolfgang Kunz, Dhiraj K. Pradhan, "Novel Verification Framework Combining Structural and OBDD Methods in a Synthesis Environment", 1995 ACM 0-89791-756-1/95/0006, pp. 1-6.

Randal E. Bryant, "Graph-Based Algorithms for Boolean Function Manipulation[12]", Department of Computer Science, Carnegie-Mellon University, Pittsburgh, PA 15213, table of contents and pp. 1-25, unavailable.

Yusuke Matsunaga, "An Efficient Equivalence Checker for Combinational Circuits", Fujitsu Laboratories Ltd., Kawasaki 211-88, Japan, 41.1, pp. 629-634, unavailable.

Corno et al., "Simulation-based Sequential Equivalence Checking of RTL VHDL", Proceedings of the 1999 IEEE International Conference on Electronics, Circuits, and Systems, vol. 1, pp. 351-354, Sep. 5, 1999.

* cited by examiner

METHOD AND APPARATUS FOR CUT-POINT FRONTIER SELECTION AND FOR COUNTER-EXAMPLE GENERATION IN FORMAL EQUIVALENCE VERIFICATION

CROSS-REFERENCE TO RELATED APPLICATION

The present application is related to U.S. patent application Ser. No. 09/734,380 entitled, "Method and System for Formal Verification of a Circuit Model,", filed Dec. 11, 2000 and assigned to the assignee of the present invention and is a divisional of U.S. patent application Ser. No. 10/291,287 with the same title as the present application, filed Nov. 7, 2002 now U.S. Pat. No. 6,792,581 and assigned to the assignee of the present invention.

FIELD

An embodiment of the present invention relates to the field of integrated circuit formal equivalence verification, and, more particularly, to an approach for determining a cut-point frontier and/or for counter-example generation.

BACKGROUND

Formal verification typically employs the use of mathematical techniques to "formally" (i.e. without simulating circuit input vectors) compare two circuit design models at the same or differing levels of abstraction to verify logic functionality equivalence between the models. For example, a formal equivalence verification process may be used to compare a logic circuit model in some hardware description language (HDL) against its implementation as a corresponding schematic model at the transistor level. The circuit model at the higher level of abstraction will be referred to herein as the specification circuit model (or spec) while the one at the lower level of abstraction will be referred to herein as the implementation circuit model (or imp).

Formal equivalence verification tools are frequently based on classical binary decision diagrams (BDDs). Classical BDDs are directed acyclic graph structures that encode the value of a Boolean logic function for all possible input value combinations. BDDs, in general, simplify the task of determining Boolean function equivalence because efficient algorithms for equivalence checking and other Boolean operations exist for BDDs. Because the size of a BDD representing a given circuit can grow exponentially larger with respect to the number of inputs and gates in the circuit, the memory requirements for using a formal equivalence verification tool that employs a classical BDD approach may be prohibitively large.

To address this issue, solutions using a divide-and-conquer approach have been developed. Such techniques attempt to partition the specification and implementation circuit models along frontiers of equivalent signal pairs called cut-points. The resulting sub-circuit partitions of each circuit model are then independently analyzed such that the verification task is broken into more manageable units. The manner in which cut-points and/or cut-point frontiers are selected can affect the performance of the associated formal equivalence verification tool.

One problem that may arise for some prior formal verification tools when introducing cut-points into circuit models is that the verification method may return a false negative. A false negative in this context is an indication by the formal equivalence verification tool that two circuits are different, when in reality, they are not. The process of eliminating false negatives can be time consuming.

Further, when a difference between two circuit models is identified, such prior tools typically do not provide the integrated circuit designer with information as to the source of the differences between two circuit models.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for selecting a cut-point frontier and/or for counter-example generation are described. In the following description, particular types of circuit models, circuits, software tools and systems are described for purposes of illustration. It will be appreciated, however, that other embodiments are applicable to other types of integrated circuit models, circuits, software tools and/or systems.

For one embodiment, both a lazy cut-point frontier and an eager cut-point frontier are identified. A lazy cut-point frontier, as the term is used herein, refers to a frontier among identified cut-points that lies closest to the previous frontier (which may be the inputs of the circuit model or the portion of the circuit model being analyzed), while an eager cut-point frontier corresponds to cut-points closest to the outputs of the circuit model or portion of the circuit model being analyzed. A cut-point frontier is a minimal set of nodes that separates a circuit of interest into two parts such that no signal path from inputs to outputs can exist without going through a node in the frontier.

Once the lazy and eager cut-point frontiers are identified, a reconvergence ratio is computed for each of the frontiers and the one with the smaller reconvergence ratio is selected as the next cut-point frontier. Alternatively, a non-reconvergence ratio may be computed for each of the frontiers and the one with the larger non-reconvergence ratio is selected as the next cut-point frontier as described in more detail below.

For another embodiment, to generate a counter-example, in response to identifying a difference in output signals for a given cut-point frontier,; values of eigenvariables and reconverging primary inputs are used to compute the corresponding values of the non-reconverging primary inputs. These corresponding values are computed to be compatible with the internal signal values implied by the cut-point assignment that was selected to expose the difference in the outputs. Counter-example, as the term is used herein, refers to an identification of variable values, for example, that cause a difference in circuits and/or circuit models to be revealed.

Additional details of these and other embodiments are provided in the description that follows.

Figure 1:
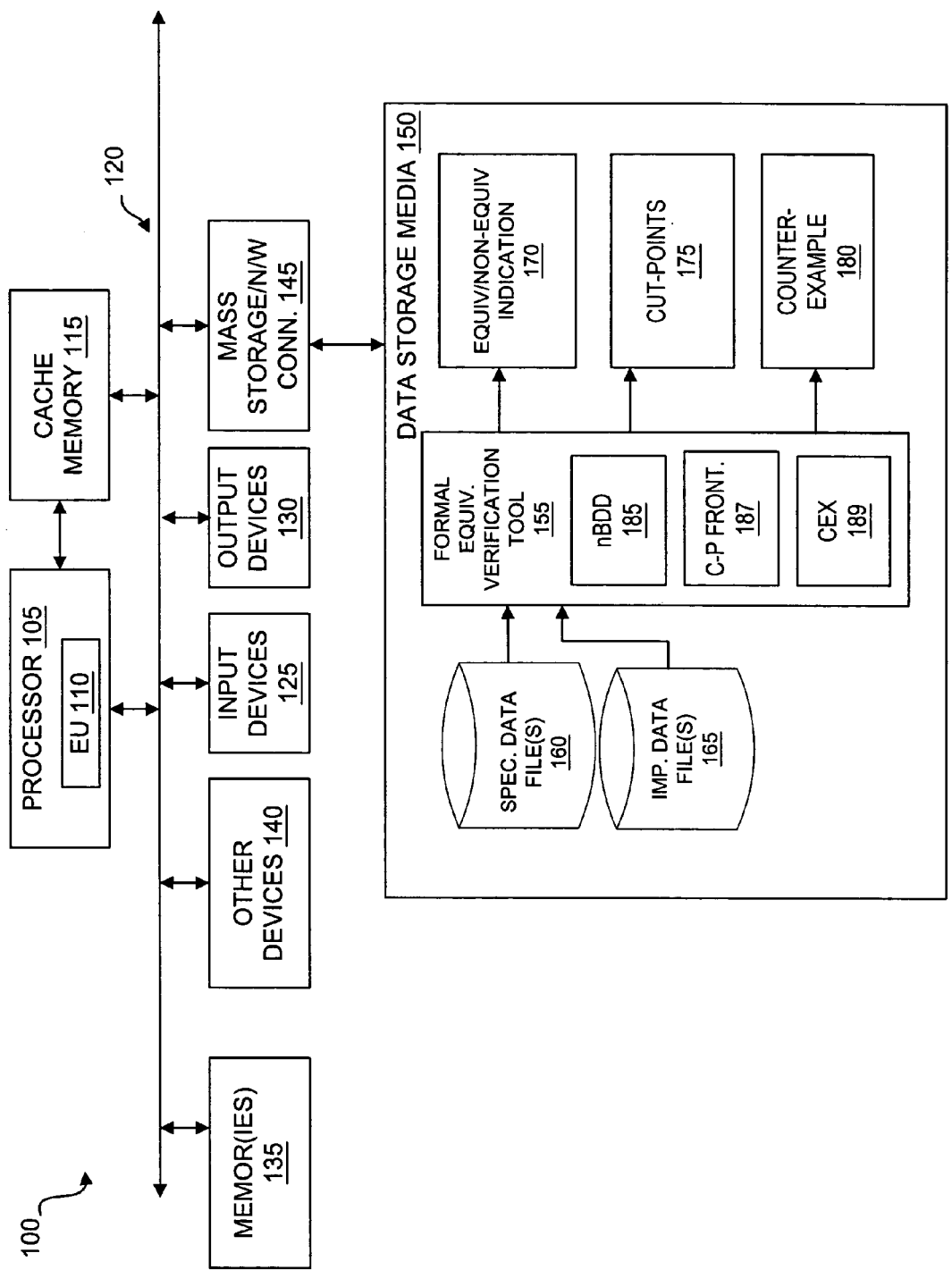
FIG. 1 is a block diagram of an exemplary system in which the cut-point frontier selection and/or counter-example generation method and/or apparatus of some embodiments may be advantageously used.

FIG. 1 is a block diagram of a computer system 100 on which the cut-point frontier selection and/or counter-example generation method and apparatus of one or more embodiments may be advantageously implemented. For this embodiment, the computer system 100 may be a personal or workstation computer system running one of a LINUX, UNIX, or Windows™ operating system, for example. (Windows operating systems are provided by Microsoft Corporation of Redmond, Wash.) Other types of computers and/or computer systems and/or computer systems running other types of operating systems are within the scope of various embodiments.

The computer system 100 includes a processor 105 to execute instructions using an execution unit 110. A cache memory 115 may be coupled to or integrated with the processor 105 to store recently and/or frequently used instructions. The processor 105 is coupled to a bus 120 to communicate information between the processor 105 and other components in the computer system 100.

For one embodiment, the processor 105 is a microprocessor. For other embodiments, however, the processor may be a different type of processor such as, for example, a microcontroller, a digital signal processor, etc.

Also coupled to the bus 120 are one or more input devices 125, such as a keyboard and/or a cursor control device, one or more output devices 130, such as a monitor and/or printer, one or more memories 135 (e.g. random access memory (RAM), read only memory (ROM), etc.), other devices 140 (e.g. memory controller, graphics controller, bus bridge, etc.), and one or more mass storage devices and/or network connectivity devices 145.

The mass storage device(s) and/or network connectivity devices 145 may include a hard disk drive, a compact disc read only memory (CD ROM) drive, an optical disk drive and/or a network connector to couple the computer system 100 to one or more other computer systems or mass storage devices over a network, for example. Further, the mass storage device(s) 145 may include additional or alternate mass storage device(s) that are accessible by the computer system 100 over a network (not shown).

A corresponding data storage medium (or media) 150 (also referred to as a computer-accessible storage medium) may be used to store instructions, data and/or one or more programs to be executed by the processor 100. For one embodiment, the computer-accessible storage medium (or media) 150 stores information, instructions and/or programs 155-189 that, when accessed or executed by the processor 100 or another machine, are used to perform cut-point frontier selection and/or counter-example generation and related actions in accordance with one or more embodiments or to provide output data. related to such actions.

For the exemplary embodiment shown in FIG. 1, for example, a formal equivalence verification tool 155 receives data 160 related to a specification circuit model and data 165 related to an implementation circuit model. The data 160 related to the specification circuit model may include, for example, the specification of a logic circuit in some hardware description language (HDL) while the data 165 related to an implementation circuit model may include, for example, what is intended to be a schematic model of the same circuit at the transistor level.

In response to receiving such data and, in some cases, user input via an input device 125, the formal equivalence verification tool 155 then provides output data that may include, for example, an indication of whether the two circuit models being compared are equivalent 170, cut-point and/or cut-point frontier information 175 and/or counter-example information 180.

For one embodiment, the formal equivalence verification tool 155 is a formal equivalence verification tool that prevents the generation of false negatives using normalized binary decision diagrams (BDDs) in accordance with copending U.S. patent application Ser. No. 09/734,380 entitled, "Method and System for Formal Verification of a Circuit Model," filed Dec. 11, 2000 and assigned to the assignee of the present invention. For such an embodiment, the formal equivalence verification tool 155 may include a normalized BDD computation engine 185, a cut-point frontier selection engine 187 and a counter-example generation engine 189. The function and operation of each of the engines 185, 187 and 189 are described in more detail below. It will be appreciated that the formal equivalence verification tool of other embodiments may not include all of the modules shown in FIG. 1 and/or may include additional modules not shown in FIG. 1.

The concept of normalized BDDs is described with reference to FIGS. 1 and 2. For purposes of illustration, to compare the specification model computing the logic function Gs and the implementation model computing the logic function Gi, for one embodiment, the formal equivalence verification tool 155 creates the miter circuit shown in FIG. 2 and checks whether Gm always produces the logic Boolean value False for all possible values at the circuits' primary inputs X. To do this, the formal verification tool 155 computes the classical BDD of Gm. Because the classical BDD for Gm may be prohibitively large, however, its computation is performed in terms of normalized BDDs of cut-points that belong to the selected cut-point frontiers.

Figure 2:
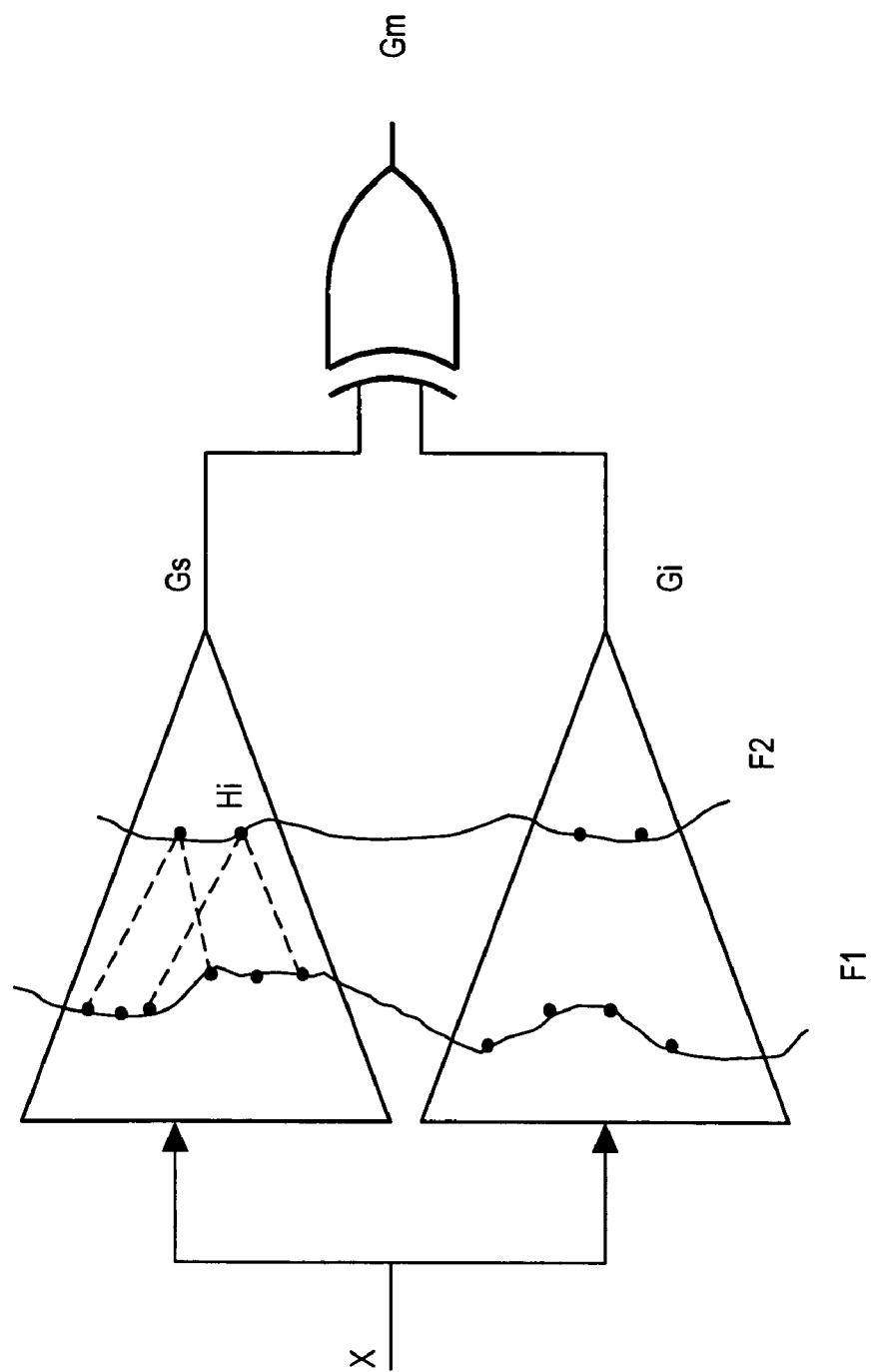
FIG. 2 is an exemplary representation of two circuit models to be compared using a formal verification approach of one embodiment.

For example, as shown in FIG. 2, the classical BDD for Gm is computed in terms of the normalized BDDs of the cut-points on frontier F2. The normalized BDDs of the cut-points on the frontier F2 are computed by normalizing their classical BDDs, which are, for this example, computed in terms of the normalized BDDs of the cut-points on frontier F1. The normalized BDDs of the cut-points on the frontier F1 are similarly computed for this example by normalizing their classical BDDs that are built in terms of the primary inputs X of the modeled circuits. By following this approach, smaller parts of the original: circuit models may be examined such that the sizes of the resulting classical and normalized BDDs are kept smaller during the formal equivalence verification checking process.

With continuing reference to FIG. 2, the process of BDD normalization is described in more detail in reference to an exemplary cut-point Hi on the cut-point frontier F2 having a classical BDD $H_i(\vec{v})$ where $\vec{v}$ are BDD variables from F1. $H_i(\vec{v})$ can be written as $H_i(\vec{n}, \vec{r})$ where $\vec{n}$ are those variables from $\vec{v}$ that do not appear in the classic BDD of another cut-point on the frontier and $\vec{r}$ are the remaining variables. The $\vec{n}$ and the $\vec{r}$ variables are called the non-reconvergent and the reconvergent variables, respectively.

Figure 3:
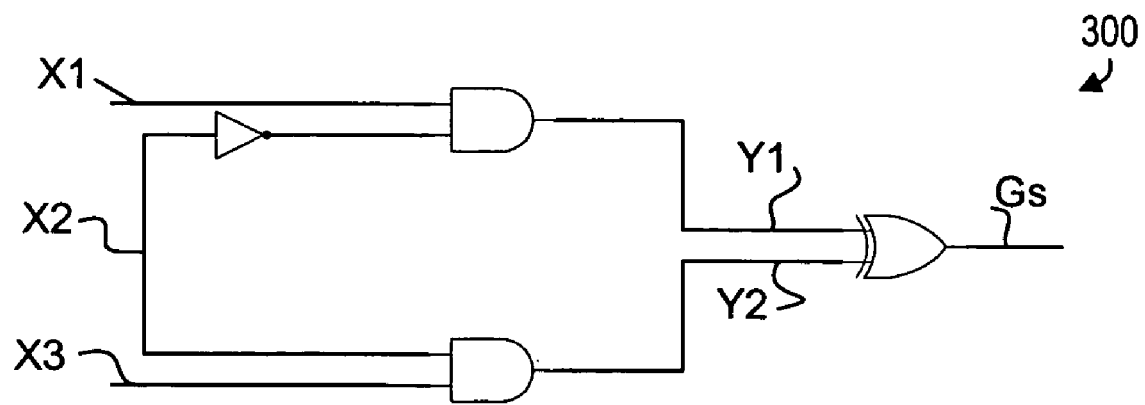
FIG. 3 is a schematic diagram of a first exemplary circuit portion that may be evaluated using the cut-point frontier selection approach and/or counter-example generation approach of one embodiment.
Figure 4:
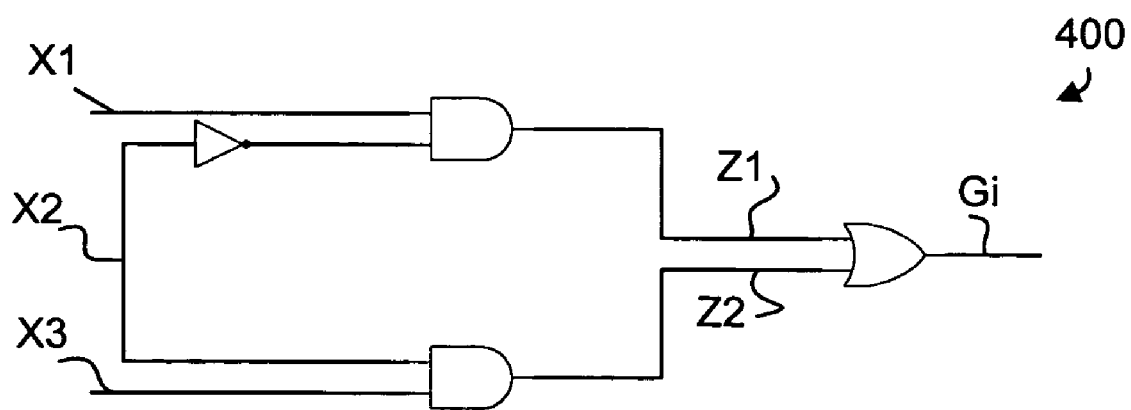
FIG. 4 is a schematic diagram of a second exemplary circuit portion that may be evaluated using the cut-point frontier selection approach and/or counter-example generation approach of one embodiment.

To illustrate the concept of reconvergent and non-reconvergent signals, reference is made to the exemplary circuit portions 300 and 400 of FIGS. 3 and 4, respectively, that may, for example, provide the signals Gs and Gi in FIG. 2. It is assumed, for purposes of example, that a selected cut-point frontier for the circuit portions 300 and 400 includes the nodes Y1, Y2, Z1 and Z2. A reconvergent signal or variable with respect to a cut-point is a signal that has a fanout leading to the circuit's output by going outside of the logic cone of the cut-point signal. Conversely, a non-reconvergent signal or variable is a signal that does not have a fanout leading outside of the logic cone of the cut-point signal towards the circuit's output. Thus, for the exemplary cut-points, the signal X2 is a reconvergent signal/variable with respect to cut-points Y1, Y2, Z1 and Z2, while X1 and X3 are non-reconvergent signals/variables. This concept is also illustrated by the broken lines between cut-points in FIG. 2.

Thus, with continuing reference to FIG. 2, the normalized BDD for $H_i(\vec{n}, \vec{r})$ is then given by the formula $e_i(\exists \vec{n}, H_i(\vec{n}, \vec{r})) + (\forall \vec{n}, H_i(\vec{n}, \vec{r}))$ where $e_i$ is a separate free Boolean variable referred to herein as the eigenvariable of $H_i$.

A high-level exemplary method for formal equivalence verification that uses normalized BDDs in accordance with one embodiment is provided by the following pseudo code in which a node $N_i$ of an implementation circuit model (e.g. the node $G_i$ of FIG. 2) is compared against a node $N_s$ of a corresponding specification circuit model (e.g. the node $G_s$ of FIG. 2).

```
Determine equivalence of (Ns, Ni) {
  i ← 0
  frontier[i] ← fanin (cone(Ns)) U fanin (cone(Ni))
  while ((bdd(Ns) is not built) or (bdd(Ni) is not built)) do
    build_bdds (cone(Ns), cone(Ni), frontier[i], size_limit)
    cut-points ← cp_ident(cone(Ns), cone (Ni))
    if (cut-points is empty) then
      increase size_limit
      continue
    else
      i ← i + 1
      frontier[i] ← front_sel(cut-points)
    end if
  end while
  if (bdd(Ns) == bdd(Ni)) then
    declare_equal( )
  else
    declare_unequal
    create counter-example (Ns, Ni)
  end if
}
```

Figure 5:
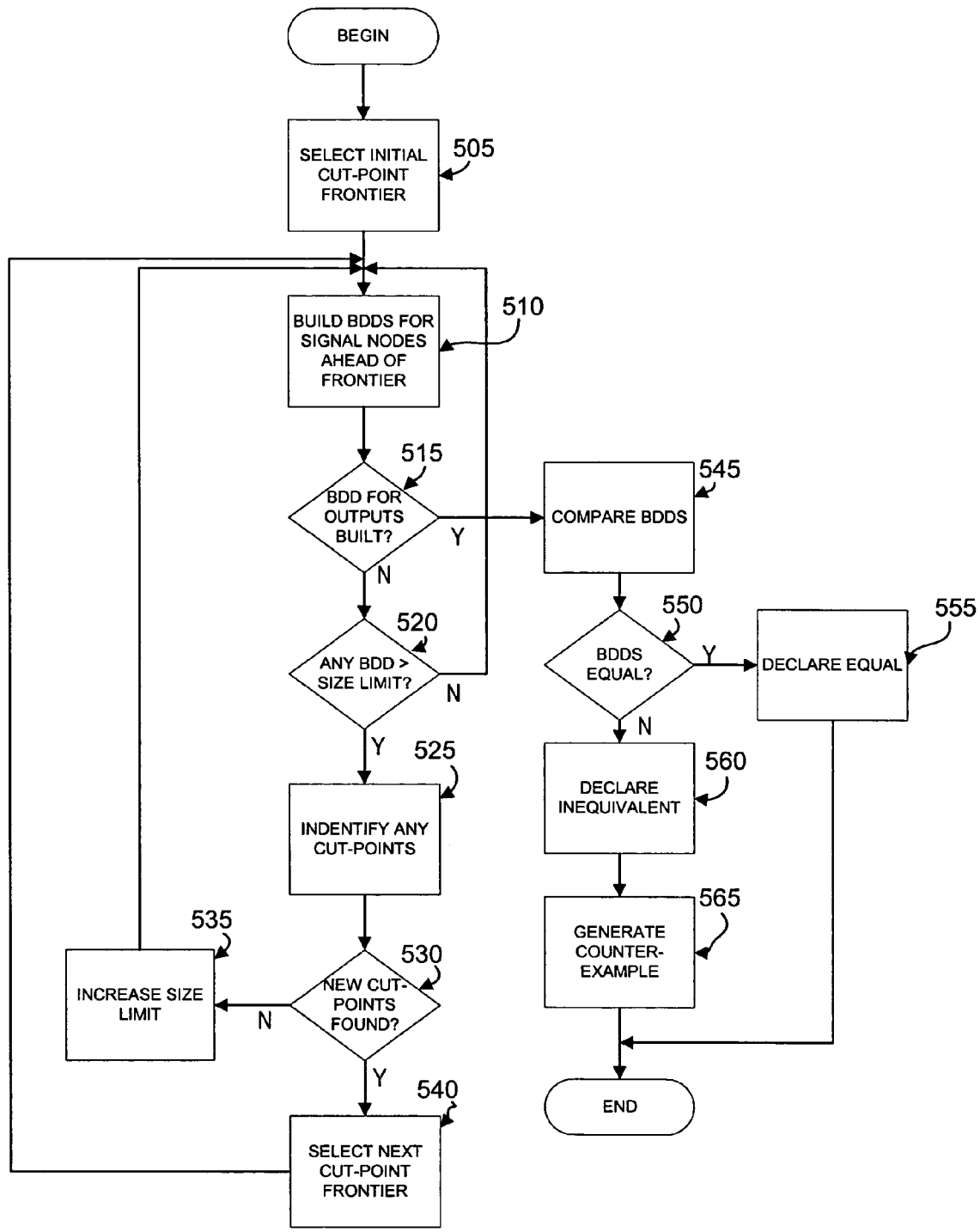
FIG. 5 is a flow diagram illustrating the formal equivalence verification approach of one embodiment.

The method implemented by the pseudo code above is further described in reference to a corresponding flow diagram shown in FIG. 5. As shown in FIG. 5, for the comparison of the functions implemented by output nodes of selected specification and implementation circuit models (e.g. $N_s$ and $N_i$ in the pseudo-code above), the cut-point frontier is initially set at the primary inputs of the cones that are driving the two signals (block 505).

Then, repeatedly, the process attempts to identify more cut-points lying ahead of the current cut-point frontier closer to $N_s$ and $N_i$ in an attempt to eventually build the BDDs for these two nodes so that they can be compared for equivalence. The function build_bdds in the pseudo code above (block 510), which may be implemented, for example, by the normalized BDD engine 185 of FIG. 1, attempts to build BDDs for the signal nodes ahead of the present frontier closer to the outputs. These BDDs are built not by assigning free variables for the cut-points on the present frontier, but by assigning to every cut-point its corresponding normalized function as discussed above and in the above-reference copending application. While the BDDs for the outputs are not yet built (block 515), the formation of BDDs stops and the build_bdd function exits the first time that some BDD exceeds a pre-specified limit (block 520). This pre-specified limit is indicated by the variable size_limit in the pseudo code above and may, for example, be user-specified.

Figure 7:
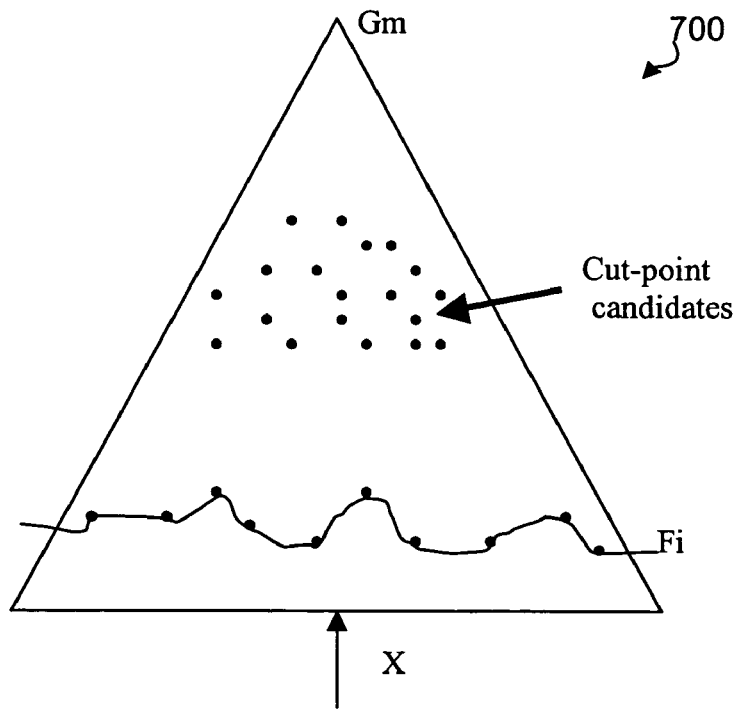
FIG. 7 is an exemplary representation of the combination of the two circuit models of FIG. 2 showing example cut-point candidates and an example cut-point frontier.

Once the function build_bdd exits, cut-point indentification (cp_ident) begins (block 525). The function cp_ident employs an associative map in which BDDs are used as keys to identify sets of equivalent nodes between the two circuit models. If no cut-points are identified among the nodes whose BDDs are built within the specified size_limit (block 530), then this limit is increased (block 535) and an attempt is made to build more BDDs ahead of the same cut-point frontier (block 510). Eventually, the set of identified cut-points becomes non-empty and a new cut-point frontier $F_i$ is selected (block 540) from the identified cut-points using the front_sel function as illustrated in FIG. 7. In FIG. 7, for purposes of simplicity, the miter circuit 700 is used to represent the miter circuit of FIG. 2.

Figure 8:
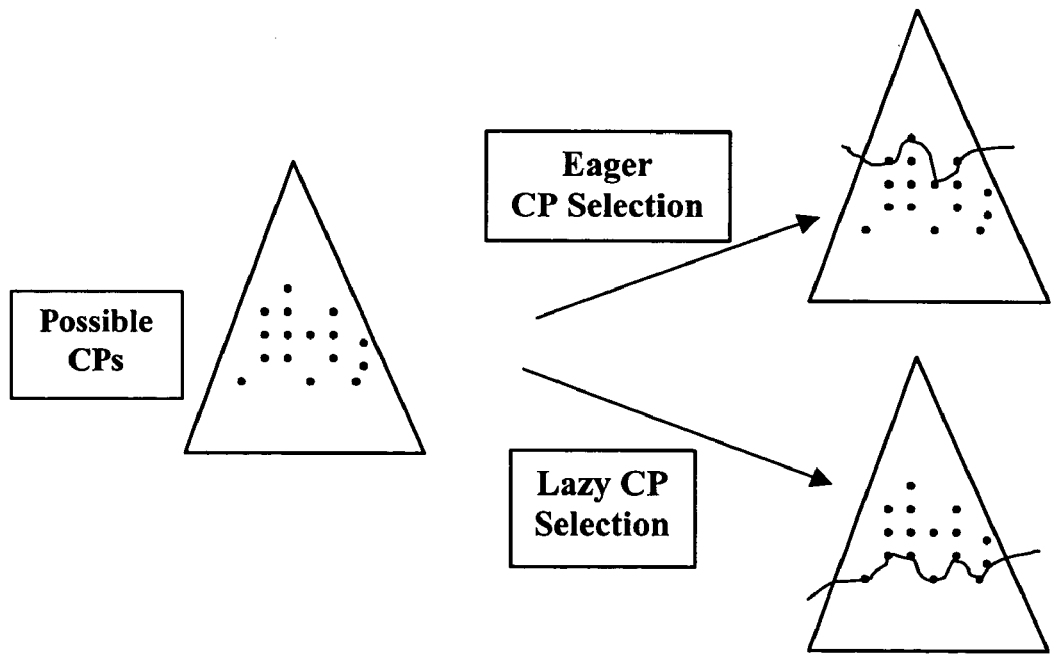
FIG. 8 is a diagram illustrating example eager and lazy cut-point frontiers that may be selected according to one embodiment.

For one embodiment, the front_sel function selects the new cut-point frontier according to one of three strategies: a lazy strategy, an eager strategy or a combined strategy. In accordance with the lazy strategy, a frontier of cut-points is selected such that is closest to the inputs as compared to other cut-point frontiers that might possibly be selected. In contrast, according to the eager strategy, a cut-point frontier that is closest to the output(s) is selected. Exemplary eager and lazy frontiers for an exemplary set of cut-points are illustrated in FIG. 8.

Cut-point frontiers that are selected in accordance with the lazy strategy generally tend to lead to smaller normalized BDDs, while cut-point frontiers that are selected according to the eager strategy generally tend to lead to a faster overall verification process because verification progresses with larger leaps towards the outputs. The relative performance of these strategies, however, may vary significantly depending on the circuit model being verified.

Figure 6:
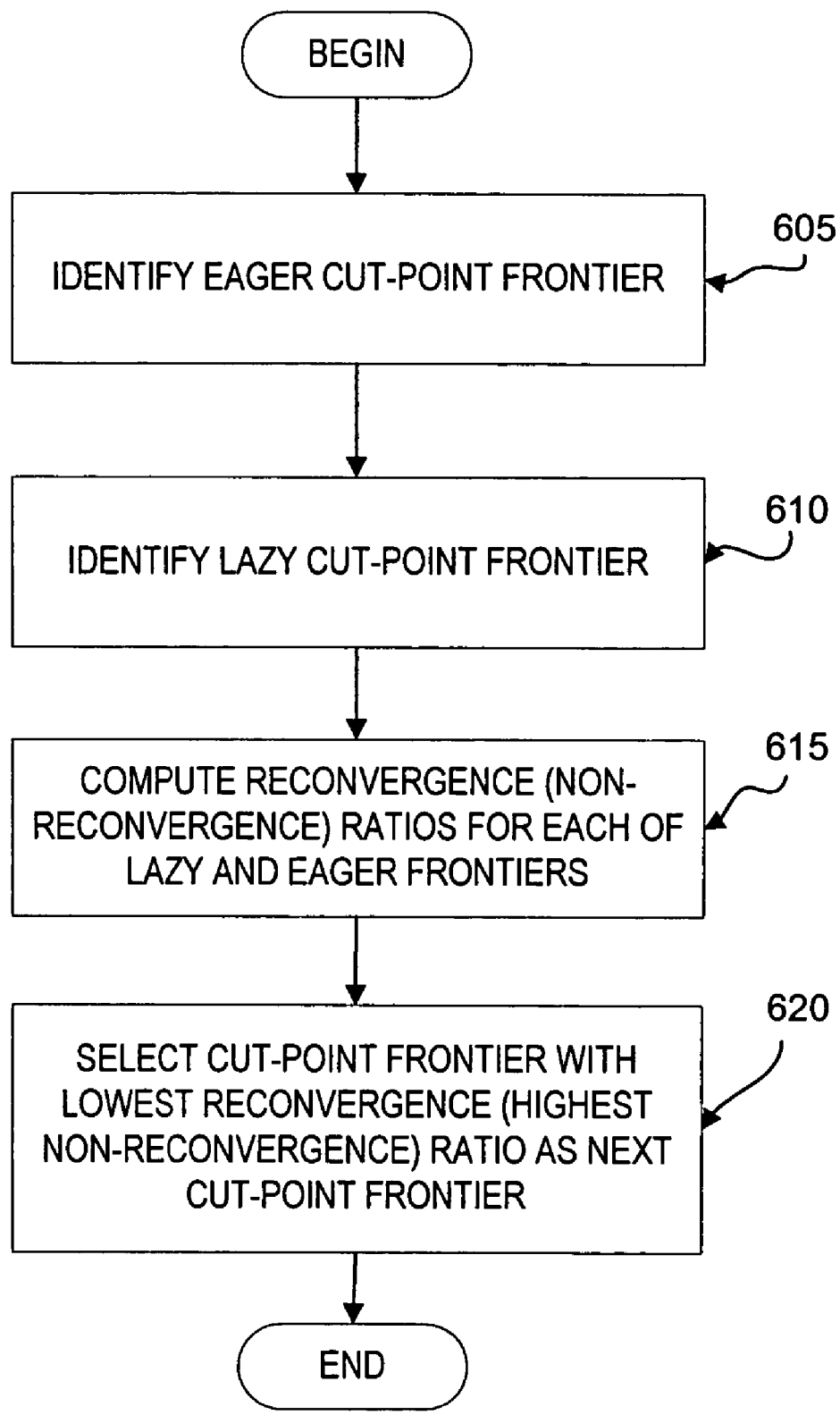
FIG. 6 is a flow diagram illustrating the cut-point frontier selection approach of one embodiment.

Thus, for some embodiments, a combination of the two strategies is used as illustrated by the flow chart of FIG. 6. The method illustrated by FIG. 6 may be implemented, for example, by the cut-point frontier selection engine 187 of FIG. 1.

For embodiments for which a combination of the two strategies is used, cut-point frontiers are identified in accordance with both the eager and lazy strategies (blocks 605 and 610) and are referred to herein as lazy and eager cut-point frontiers. It will be appreciated that, for other embodiments, the order of blocks 605 and 610 may be reversed.

For one embodiment, to identify the eager frontier at block 605, from the outputs of the specification and implementation circuit models of interest, a depth first traversal is performed stopping either at primary inputs or cut-points identified as described above. To identify the lazy frontier at block 610, a depth first traversal is performed from the present cut-point frontier towards the outputs stopping at newly found cut-points.

For one embodiment, a reconvergence ratio is then computed for each of the lazy and eager frontiers (block 615). The reconvergence ratio for a frontier is the ratio of reconverging variables over the total number of variables in the BDDs for the cut-points. Once this ratio has been computed for each of the lazy and eager frontiers, the frontier with the smallest reconvergence ratio is selected as the next cut-point frontier (block 620).

For an alternative embodiment, a non-reconvergence ratio may instead be computed (block 615). The non-reconvergence ratio for a frontier is the ratio of non-reconverging variables over the total number of variables in the BDDs for the cut-points associated with the frontier. Where this approach is used, the frontier with the largest non-reconvergence ratio is selected as the next cut-point frontier (block 620).

Referring to FIG. 2 for purposes of illustration, where the frontier F1 is the prior frontier and the frontier F2 is one of the identified eager or lazy cut-point frontiers as described above, the reconvergence (or non-reconvergence) ratio associated with F2 may be calculated in the following manner. The BDDs for each of the cut-points associated with the frontier F2 are analyzed to determine which cut-points from F1 affect them. Based on this analysis, the number of BDDs on F2 in which any cut-point from F1 appears can then be determined. If this number is greater than 1, the variable corresponding to the cut-point on F1 is determined to be a reconvergent variable. Otherwise, the variable is a non-reconvergent variable.

Once all BDDs for the cut-points on F2 have been analyzed in this manner, the reconvergence or non-reconvergence ratio associated with the frontier F2 can be calculated in the manner described above. The reconvergence or non-reconvergence ratio for the other identified cut-point frontier (either lazy or eager) is then calculated in a similar manner, compared to the previously calculated ratio as described above and the desired cut-point frontier is then selected.

Using the above-described combined strategy for cut-point frontier selection, even with the overhead of identifying two separate frontiers and selecting between them, it may be possible to verify larger circuits than with prior approaches and/or it may be possible to perform formal equivalence verification for complex test cases more quickly.

Referring back to FIG. 5, after the selection of the new frontier 540, the process of building additional BDDs is continued (block 510). Eventually, if the BDDs for the outputs of the two cones are built (block 515), they are compared (block 545). The BDDs for the two outputs are derived based on the last selected cut-point frontier and the normalized functions of the cut-points on this frontier. If the BDDs are equal (block 550), the nodes are declared as equal (block 555). If the BDDs are different, however, the nodes are declared as being inequivalent (block 560) and, for one embodiment, a counter-example is generated (block 565) to indicate to the designer, the source of the inequivalence. In this manner, debugging of a faulty circuit may proceed more efficiently.

It will be appreciated that, for embodiments for which the formal verification process inherently avoids the generation of false negatives, a false negative elimination process does not need to be performed in response to identifying nodes as being inequivalent. For such embodiments, any identified inequivalence is due to the presence of a bug. In contrast to other approaches that require the re-substitution of cut-point variables by their driving functions, where normalized BDDs are used as described above, for one embodiment, an efficient approach that does not require an inordinate amount of memory may be used to generate a corresponding counter-example.

The counter-example (cex) generation approach of one embodiment for exemplary nodes Ns and Ni is represented by the following pseudo-code and may be implemented, for example, by the counter-example generation engine 189 of FIG. 1.

| | |
|---|---|
| Create cex (Ns, Ni) { | (line 1) |
|   cex ← satisfy (bdd(Ns) ⊕ bdd(Ni)) | (line 2) |
|   while (cex contains eigenvariables) do | (line 3) |
|     v = select_eigenvar (cex) | (line 4) |
|     f = substitute (cex, bdd(node_of(v)) | (line 5) |
|     nf= substitute (cex, nbdd(node_of(v)) | (line 6) |
|     cex1 ← satisfy (f ⊙ nf) | (line 7) |
|     cex ← merge (v, cex, cex1) | (line 8) |
|   end while | (line 9) |
|   return cex | (line 10) |

The counter-example generation approach of one embodiment is now described in more detail. As mentioned above, a counter-example is generated based on the values of eigenvariables and reconverging primary inputs associated with the sequence of cut-point frontier selections that exposed a difference in the circuit outputs. The approach of one embodiment for counter-example generation is described in reference to exemplary circuit portions 900 and 905 of FIG. 9, which are determined to be inequivalent in the following manner.

A cut-point frontier F1 including the cut-points $y_1$, $y_2$, $z_1$, and $z_2$ is selected as described above in reference to FIG. 6. The classical BDDs for the cut-points are calculated as follows:

$$BDD \rightarrow y_1 = x_1 x_2 x_3$$

$$y_2 = x_4 x_5 \bar{x}_3$$

$$z_1 = x_1 x_2 x_3$$

$$z_2 = x_4 x_5 \bar{x}_3$$

So frontier F1 includes cut-points $C_1 = (y_1, z_1)$ and $C_2 = (y_2, z_2)$ with corresponding BDDs $x_1 x_2 x_3$ and $x_4 x_5 \bar{x}_3$, respectively. As can be seen, each of the variables $x_1$, $x_2$, $x_4$ and $x_5$ appear in only one of the BDDs associated with the cut-points $C_1$ and $C_2$ on F1 and are, therefore, non-reconvergent variables. The variable $x_3$, however, appears in two BDDs and is, therefore, a reconvergent variable.

Then, as described above, the classical BDDs for the cut-points $C_1$ and $C_2$ on F1 are normalized.

$$C_1(\vec{n}, \vec{r}) = x_1 x_2 x_3 \text{ with } \vec{n} = \langle x_1, x_2 \rangle \text{ and } \vec{r} = \langle x_3 \rangle$$

$$C_2(\vec{n}, \vec{r}) = x_4 x_5 x_3 \text{ with } \vec{n} = \langle x_4, x_5 \rangle \text{ and } \vec{r} = \langle x_3 \rangle$$

The normalized BDD for $C_1$ is calculated as follows:

$$ei \cdot (\exists \vec{n}, C_1(\vec{n}, \vec{r})) + (\forall \vec{n}, C_1(\vec{n}, \vec{r})) = ei \cdot (\exists x_1 x_2, x_1 x_2 x_3) +$$
$$(\forall \times 1 \times 2, x_1 x_2 x_3)$$
$$= ei \cdot (1 \cdot 1 \cdot x_3 + 1 \cdot 0 \cdot x_3 +$$
$$0 \cdot 1 \cdot x_3 + 0 \cdot 0 \cdot x_3) +$$
$$((1 \cdot 1 \cdot x_3) \cdot (1 \cdot 0 \cdot x_3) \cdot$$
$$(0 \cdot 1 \cdot x_3) \cdot (0 \cdot 0 \cdot x_3))$$
$$= e1 \cdot x_3$$

The normalized BDD for $C_2$ is calculated in a similar manner and determined to be equal to $e2 \cdot \bar{x}_3$ as eigenvariable $e_2$ takes the place of $e_1$, $x_4$ corresponds to $x_1$, $x_5$ corresponds to $x_2$ and finally $\bar{x}_3$ takes the place of $x_3$.

So the cut-points $C_1$ and $C_2$ on F1 have respectively normalized BDDs $e_1 \cdot x_3$ and $e_2 \cdot \bar{x}_3$. Based on this, the BDD for $Ws = e_1 \cdot x_3 + e_2 \cdot \bar{x}_3$ while the BDD for $Wi = (e_1 \cdot x_3) \cdot (e_2 \cdot \bar{x}_3) = 0$.

Clearly, Ws≠Wi and, therefore, the associated circuit models are not equivalent. Because the formal equivalence verification of the circuit models was performed in a manner that prevents generation of false-negatives as described above, no additional false negative elimination process is necessary.

Figure 9:
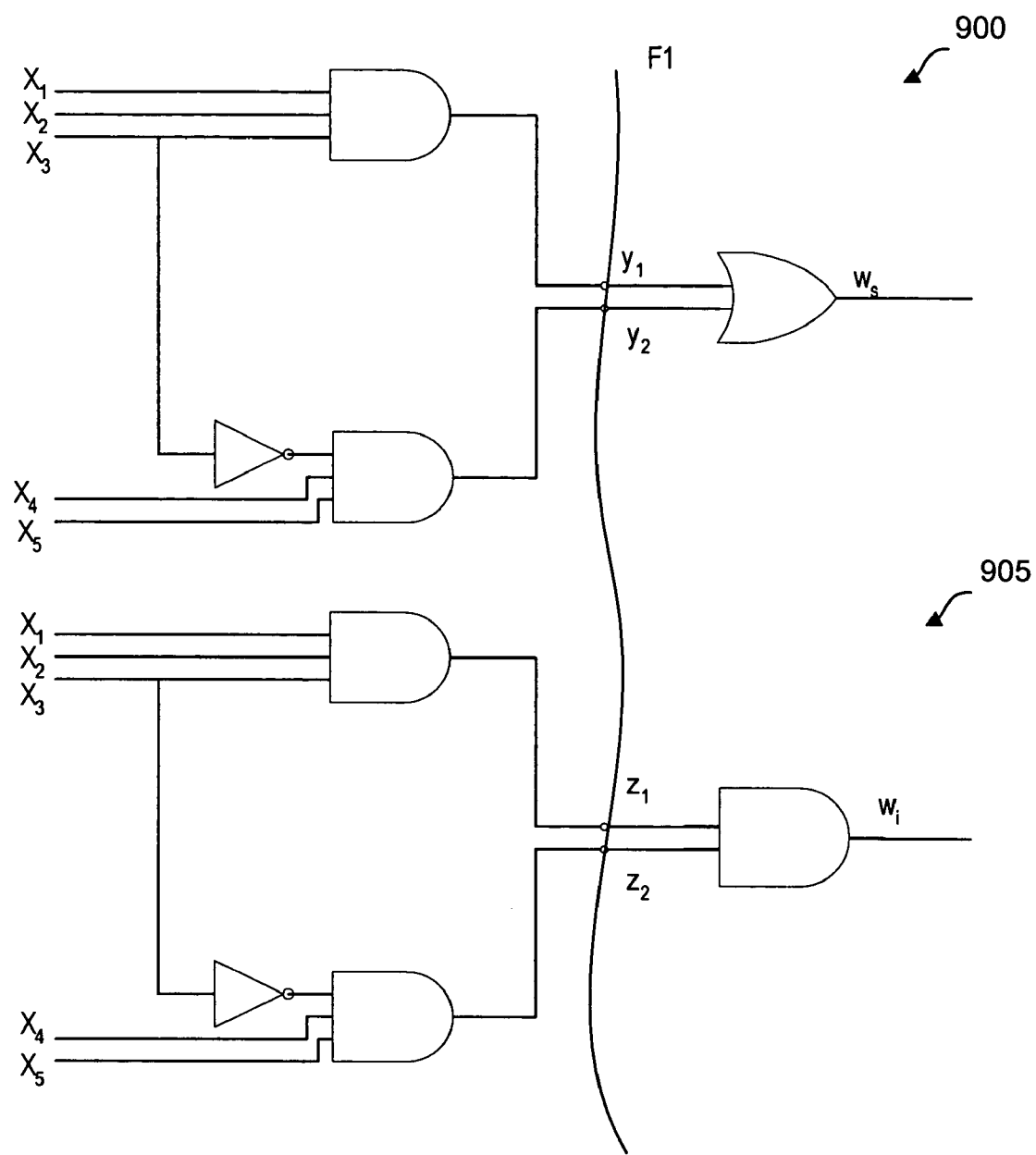
FIG. 9 is a schematic diagram of two exemplary circuit portions that may be compared and for which a counter-example may be generated in accordance with one embodiment.
Figure 10:
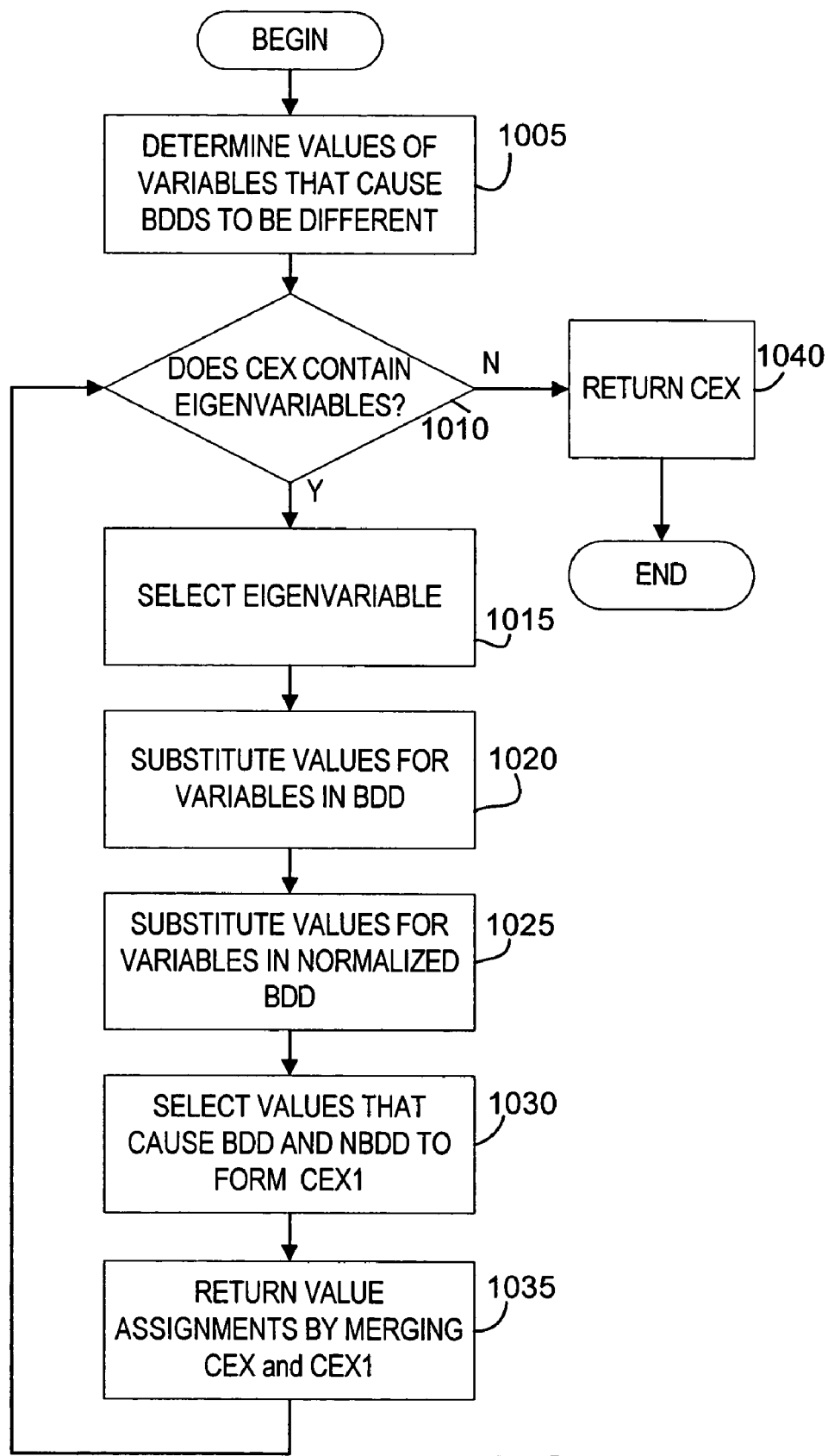
FIG. 10 is a flow diagram illustrating the counter-example generation approach of one embodiment.

With continuing reference to FIG. 9 and the flow chart of FIG. 10, to generate the corresponding counter-example, it is first determined what values of primary input variables variables and cut-point-associated eigenvariables cause an exclusive OR (XOR) of the BDDs for the outputs Ws and Wi of the two models to be true (block 1005) (i.e. what values cause the BDDs of the outputs Ws and Wi of the two models to be different) (line 2 of the pseudo code).

For the circuit model of FIG. 9, Ns in the pseudo code above is Ws with a BDD of $e_1 x_3 + e_2 \bar{x}_3$ while Ni is Wi with a BDD of 0. So cex←satisfy $((e_1 x_3 + e_2 \bar{x}_3) \oplus 0)$ cex←satisfy $(e_1 x_3 + e_2 \bar{x}_3)$ which can happen in one of 2 ways:

either $(e_1=1, x_3=1) \rightarrow$ cex_1, or $(e_2=1, x_3=0) \rightarrow$ cex_2.

For purposes of example, it is assumed that cex2=<$e_2=1$, $x_3=0$> is selected.

At line 3 of the pseudo code, while cex contains an eigenvariable (block 1010), an eigenvariable from cex is selected (block 1015 and line 4). For this example, there is only one eigenvariable e2, which is the eigenvariable for the cut-point $C_2$ ($y_2$ or $z_2$). The variables in the BDD of the node corresponding to the selected eigenvariable are then substituted with their corresponding values from the cex constructed so far. This happens for exactly those variables of the BDD that have been assigned values in the counter example (block 1020 and line 5). So in this example, node_of $(v)$=node_of $(e_2)=z_2$ or $y_2$ $bdd(z_2)=bdd(y_2)=x_4 x_5 \bar{x}_3$ $f$=substitute (<$e_2=1$, $x_3=0$> into $x_4 x_5 \bar{x}_3$)=$x_4 x_5 \cdot \bar{0} = x_4 x_5 \cdot 1$ $f = x_4 x_5$ At line 6 of the pseudo code and block 1025 of FIG. 10, this process is repeated for the normalized BDD. For this example, node_of($v$)=node_of($e_2$)=$y_2$ or $z_2$ as previously discussed $nbdd(y_2)=nbdd(z_2)=e_2 \bar{x}_3$ $nf$=substitute (<$e_2=1$, $x_3=0$> into $e_2 \bar{x}_3$)

$nf = 1 \cdot \bar{0} = 1 \cdot 1 = 1$

At line 7 of the pseudo code (block 1030 of FIG. 10), the values that cause f and nf to be equal are determined:

cex1←satisfy (f nf)

here f=$x_4 x_5$ and nf=1 so f nf=$x_4 x_5 1 = x_4 x_5$ satisfy $(x_4 x_5) \rightarrow x_4=1$, $x_5=1$ thus cex1=<$x_4=1$, $x_5=1$>

At line 8 of the pseudo code (block 1035 of FIG. 10) the value assignments from cex and cex1 are returned excluding the assignment for the variable v. The goal of this part of the process is to continue to make all the eigenvariable assignments disappear such that, at the end of the process, only assignments at the primary inputs remain. Thus, for this example, cex←merge (v, cex, cex1)

cex←merge ($e_2$, <$e_2=1$, $x_3=0$>, <$x_4=1$, $x_5=1$>)

cex←<$x_3=0$, $x_4=1$, $x_5=1$>

At this point, it is again determined whether cex contains any more eigenvariables (line 3, block 1010). In this example, cex=<$x_3=0$, $x_4=1$, $x_5=1$> and thus, contains no eigenvariables. The counter example is then returned at block 1040 (line 10 of the pseudo code).

Therefore, for this example, the counter example is <$x_3=0$, $x_4=1$, $x_5=1$>, which, regardless of the values for $x_1$ and $x_2$ causes Ws=1 and Wi=0.

Using the above-described counter-example generation approach of one embodiment, once two circuit models are determined to be inequivalent, information can be provided back to a circuit designer, for example, to indicate one or more input variable combinations that cause the difference in circuit models to be revealed.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
   using a divide-and-conquer approach to formal equivalence verification, the divide-and-conquer approach including building normalized binary decision diagrams (BDDs);

determining that a specification circuit model and an implementation circuit model are inequivalent based on the normalized BDDs; and generating a counter-example for the inequivalent models, wherein generating the counter-example comprises:

determining values of a first set of variables that cause binary decision diagrams for the models to be inequivalent;

while the first set of variables includes eigenvariables, selecting an eigenvariable;

substituting the determined values into a binary decision diagram associated with a node associated with the selected eigenvariable;

substituting the determined values into a normalized binary decision diagram associated with a node associated with the selected eigenvariable;

identifying values of a second set of variables that cause the binary decision diagram and normalized binary decision diagram into which the determined values were substituted to be equal; and returning the identified values for the first and second sets of variables.

2. The method of claim 1 further comprising:

returning a counter-example in response to determining that the first set of variables does not include any eigenvariables.

3. The method of claim 1 wherein generating the counter-example comprises:

working back from the outputs of the circuit models to the inputs of the circuit models to identify values of primary inputs to the circuit models that cause the circuit models to produce a different result.

4. The method of claim 1 wherein determining that a specification circuit model and an implementation circuit model are inequivalent includes identifying a difference in output signals for a given cut-point frontier wherein the cut-point frontier is selected by:

identifying a lazy cut-point frontier and an eager cut-point frontier;

computing a ratio of one of reconverging and non-reconverging variables to a total number of variables for each of the identified lazy and eager cut-point frontiers; and selecting from the lazy and eager cut-point frontiers based on the computed ratios.

5. The method of claim 4 wherein computing a ratio comprises computing a ratio of reconverging variables to a total number of variables (reconvergence ratio), and wherein selecting comprises selecting the cut-point frontier with the smallest reconvergence ratio.

6. The method of claim 4 wherein computing a ratio comprises computing a ratio of non-reconverging variables to a total number of variables (non-reconvergence ratio), and wherein selecting comprises selecting the cut-point frontier with the largest non-reconvergence ratio.

7. The method of claim 4 wherein identifying a lazy cut-point frontier and an eager cut-point frontier includes identifying the lazy and eager cut-point frontiers based on cut-points identified in a specification circuit model and an implementation circuit model.

8. A machine-accessible storage medium storing instructions that, when accessed by a machine, cause the machine to:

use a divide-and-conquer approach to formal equivalence verification the divide-and-conquer approach including building normalized binary decision diagrams (BDDs);

determine that a specification circuit model and an implementation circuit model are inequivalent based on the normalized BDDs; and generate a counter-example for the inequivalent models, wherein causing the machine to generate a counter-example includes causing the machine to:

determining values of a first set of variables that cause binary decision diagrams for the models to be inequivalent;

while the first set of variables includes eigenvariables, select an eigenvariable;

substitute the determined values into a binary decision diagram associated with a node associated with the selected eigenvariable;

substitute the determined values into a normalized binary decision diagram associated with a node associated with the selected eigenvariable;

identify values of a second set of variables that cause the binary decision diagram and normalized binary decision diagram into which the determined values were substituted to be equal; and return the identified values for the first and second sets of variables.

9. The machine-accessible storage medium of claim 8 wherein the specification circuit model is provided in a hardware description language and the implementation model is a schematic model.

10. The machine accessible medium of claim 8 further comprising instructions that, when executed, cause the machine to:

return a counter-example in response to determining that the first set of variables does not include any eigenvariables.

11. The machine-accessible medium of claim 8 wherein generating the counter-example comprises:

working back from the outputs of the circuit models to the inputs of the circuit models to identify values of primary inputs to the circuit models that cause the circuit models to produce a different result.

12. The machine-accessible storage medium of claim 8 wherein determining that a specification circuit model and an implementation circuit model are inequivalent includes identifying a difference in output signals for a given cut-point frontier wherein the cut-point frontier is selected by:

identifying a lazy cut-point frontier and an eager cut-point frontier;

computing a ratio of one of reconverging and non-reconverging variables to a total number of variables for each of the identified lazy and eager cut-point frontiers; and selecting from the lazy and eager cut-point frontiers based on the computed ratios.

13. The machine-accessible storage medium of claim 12 wherein computing a ratio comprises computing a ratio of reconverging variables to a total number of variables (reconvergence ratio), and wherein selecting comprises selecting the cut-point frontier with the smallest reconvergence ratio.

14. The machine-accessible storage medium of claim 12 wherein computing a ratio comprises computing a ratio of non-reconverging variables to a total number of variables (non-reconvergence ratio), and wherein selecting comprises-selecting the cut-point frontier with the largest non-reconvergence ratio.

15. A method comprising:

using a divide-and-conquer approach to formal equivalence verification;

determining that a specification circuit model and an implementation circuit model are inequivalent by identifying a difference in output signals for a given cut-point frontier wherein the cut-point frontier is selected by:

identifying a lazy cut-point frontier and an eager cut-point frontier;

computing a ratio of one of reconverging and non-reconverging variables to a total number of variables for each of the identified lazy and eager cut-point frontiers, and selecting from the lazy and eager cut-point frontiers based on the computed ratios, and generating a counter-example for the inequivalent models, wherein generating the counter-example comprises:

determining values of a first set of variables that cause binary decision diagrams for the models to be inequivalent;

while the first set of variables includes eigenvariables, selecting an eigenvariable;

substituting the determined values into a binary decision diagram associated with a node associated with the selected eigenvariable;

substituting the determined values into a normalized binary decision diagram associated with a node associated with the selected eigenvariable;

identifying values of a second set of variables that cause the binary decision diagram and normalized binary decision diagram into which the determined values were substituted to be equal; and returning the identified values for the first and second sets of variables.

16. The method of claim 15 comprising:

computing a ratio comprises computing a ratio of reconverging variables to a total number of variables (reconvergence ratio), and wherein selecting comprises selecting the cut-point frontier with the smallest reconvergence ratio.

17. The method of claim 15 comprising:

computing a ratio comprises computing a ratio of non-reconverging variables to a total number of variables (non-reconvergence ratio), and wherein selecting comprises selecting the cut-point frontier with the largest non-reconvergence ratio.

18. The method of claim 15 comprising:

identifying a lazy cut-point frontier and an eager cut-point frontier includes identifying the lazy and eager cut-point frontiers based on cut-points identified in a specification circuit model and an implementation circuit model.

* * * * *